(12) United States Patent
Tzeng et al.

(10) Patent No.: US 11,005,091 B2
(45) Date of Patent: May 11, 2021

(54) COMPOSITE ELECTRODE MATERIAL AND METHOD FOR MANUFACTURING THE SAME

(71) Applicant: National Cheng Kung University, Tainan (TW)

(72) Inventors: Yon-Hua Tzeng, Tainan (TW); Wai-Leong Chen, Tainan (TW); Wei-Chih Huang, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 40 days.

(21) Appl. No.: 15/828,459

(22) Filed: Dec. 1, 2017

(65) Prior Publication Data
US 2019/0067681 A1   Feb. 28, 2019

(30) Foreign Application Priority Data

Aug. 29, 2017   (TW) .................. 106129288

(51) Int. Cl.
| | |
|---|---|
| *H01M 4/1393* | (2010.01) |
| *H01M 10/0525* | (2010.01) |
| *C23C 16/26* | (2006.01) |
| *C01B 32/168* | (2017.01) |
| *H01M 4/04* | (2006.01) |
| *C01B 32/16* | (2017.01) |
| *H01M 4/36* | (2006.01) |
| *H01M 4/62* | (2006.01) |

(Continued)

(52) U.S. Cl.
CPC .......... *H01M 4/1393* (2013.01); *C01B 32/16* (2017.08); *C01B 32/168* (2017.08); *C23C 16/26* (2013.01); *C23C 16/4418* (2013.01); *H01M 4/0428* (2013.01); *H01M 4/1395* (2013.01); *H01M 4/366* (2013.01); *H01M 4/587* (2013.01); *H01M 4/625* (2013.01); *H01M 10/0525* (2013.01); *G01J 3/44* (2013.01); *H01M 4/386* (2013.01); *H01M 4/387* (2013.01); *H01M 2004/027* (2013.01)

(58) Field of Classification Search
CPC .... H01M 4/134; H01M 4/625; H01M 4/1393; H01M 10/0525
See application file for complete search history.

(56) References Cited

U.S. PATENT DOCUMENTS

| | | | |
|---|---|---|---|
| 9,548,491 B2 | 1/2017 | Cho et al. | |
| 2007/0111102 A1* | 5/2007 | Inoue | H01M 4/362 |
| | | | 429/232 |

(Continued)

FOREIGN PATENT DOCUMENTS

| | | |
|---|---|---|
| CN | 101752605 A | 6/2010 |
| CN | 105612277 A | 5/2016 |

*Primary Examiner* — Karie O'Neill Apicella
(74) *Attorney, Agent, or Firm* — Bacon & Thomas, PLLC (57) ABSTRACT

A novel composite electrode material and a method for manufacturing the same, a composite electrode containing said composite electrode material, and a Li-based battery comprising said composite electrode are disclosed. Herein, the composite electrode material of the present invention comprises: a core, wherein a material of the core is at least one selected from the group consisting of Sn, Sb, Si, Ge, C, and compounds thereof; and a carbon nanotube or a carbon fiber, wherein the carbon nanotube or the carbon fiber grows on a surface including a surface of the core.

13 Claims, 9 Drawing Sheets

(51) Int. Cl.
*H01M 4/1395* (2010.01)
*H01M 4/587* (2010.01)
*C23C 16/44* (2006.01)
H01M 4/38 (2006.01)
G01J 3/44 (2006.01)
H01M 4/02 (2006.01)

(56) References Cited

U.S. PATENT DOCUMENTS

| | | | |
|---|---|---|---|
| 2008/0261116 A1* | 10/2008 | Burton | H01M 4/366 429/231.8 |
| 2009/0142665 A1* | 6/2009 | Sheem | H01M 4/366 429/213 |
| 2014/0127558 A1 | 5/2014 | Kang et al. | |
| 2017/0077497 A1* | 3/2017 | Ogata | H01M 4/364 |

* cited by examiner

COMPOSITE ELECTRODE MATERIAL AND METHOD FOR MANUFACTURING THE SAME

CROSS REFERENCE TO RELATED APPLICATION

This application claims the benefits of the Taiwan Patent Application Serial Number 106129288, filed on Aug. 29, 2017, the subject matter of which is incorporated herein by reference.

BACKGROUND OF THE INVENTION

1. Field of the Invention

The present invention relates to a composite electrode material and method for manufacturing the same.

2. Description of Related Art

Lithium ion battery is nowadays considered as one of the most efficient ways to store energy due to its high working voltage, high energy density, high battery power, long storage lifespan, and repeated charging/discharging. At present, graphite is the most commonly used commercial anode material for Li-ion battery, and the theoretical charge storage capacity value is about 372 $mAhg^{-1}$. A solid electrolyte interphase (SEI) will be formed on the surface after the first charge of the battery resulting in an irreversible capacity loss. Hence, the actual capacity value is lower than the theoretical value. Furthermore, repeated charge/discharge process also generates gaps between graphite layers leading to cracking of the graphite and capacity loss. With the advance of science and technology, simple graphite electrode is unable to meet the needs of the public.

Recently, silicon has drawn lots of attention since it has a theoretical capacity value of up to 4200 $mAhg^{-1}$. However, volume change of silicon is up to about 400% in the charge/discharge process. Therefore, it is likely to cause pulverization of silicon. The pulverized silicon particles will lose electrical contact among themselves and with the current collector of the battery. Because electrons cannot be transported to or from broken and electrically isolated silicon particles, positively charged lithium ions also cannot be added or removed from those broken and electrically isolated silicon particles. The charge storage capacity of the battery will thus decrease. At the same time, new surface formed on the pulverized silicon particles will consume additional electrolyte and react with it to form new SEI. The electrolyte is finally depleted due to the formation of more and more SEI on increasing new surfaces of pulverized silicon, resulting in a shortened battery lifespan.

Therefore, there is a need to develop a composite electrode material, which not only can overcome defects resulting from repeated charge/discharge processes to prolong the Li-ion battery lifespan, but also has a high capacity value.

SUMMARY OF THE INVENTION

One objective of the present invention is to provide a novel composite electrode material and method for manufacturing the same, a composite electrode comprising said composite electrode material, and a Li-based battery comprising said composite electrode. The novel composite electrode material uses silicon or Si-based compounds coated with carbon nanotubes (CNT) or carbon fibers (CF). Thereby, the Li-based battery has an excellent capacity, efficiency, and cycle life after repeated charge/discharge.

Another objective of the present invention is to provide a composite electrode material, comprising: a core, wherein a material of the core is at least one selected from the group consisting of Sn, Sb, Si, Ge, C, and compounds thereof; and a carbon nanotube or a carbon fiber, wherein the carbon nanotube or the carbon fiber grows on a surface including a surface of the core, which may also include a surface of other carbon nanotubes or carbon fibers, to form a three-dimensional porous carbon structure.

Further objective of the present invention is to provide a method for manufacturing a composite electrode material, comprising steps of: providing a core, wherein a material of the core is at least one selected from the group consisting of Sn, Sb, Si, Ge, C, and compounds thereof; and growing a carbon nanotube or a carbon fiber on a surface through a chemical vapor deposition using a catalyst, wherein the surface includes a surface of the core.

Preferably, another carbon nanotube or carbon fiber grows from a surface of said carbon nanotube or carbon fiber through the chemical vapor deposition using a catalyst, and thus form a three-dimensional porous carbon structure coating the core.

According to the composite electrode material and method for manufacturing the same of the present invention, the material of the core preferably is Si in order to provide a high capacity value. Further, shape and size of the core are not limited. Preferably, the core is a thin sheet of paper-like silicon flake. Since a thin silicon flake is more elastic and flexible, it is not easily broken during charge/discharge. Further, by comparing a silicon flake with all the smaller silicon particles formed when the silicon flake is broken or pulverized, the total volume and weight are the same, but the broken or pulverized smaller silicon particles exhibit a much larger total surface area than that of a silicon flake. As a result, there is a decrease in the consumption of the electrolyte for forming SEI on the surface of a sheet of paper-like silicon flake, and it benefits longer battery lifespan. In addition, the size of the core is not limited. Preferably, a thickness of the core is in a range from 50 nm to 500 nm, and more preferably 50 nm to 250 nm; and/or the length or width of the core are preferably in a range from 100 nm to 9 µm, more preferably 500 nm to 1200 nm.

In addition, the carbon nanotube or the carbon fiber may grow upright or at various angles on a surface of the core, and the excess carbon nanotubes or carbon fibers may grow on other CNT or CF to form a three-dimensional (3D) porous mesh or sponge-like structure of the CNT or CF coated silicon particles. The structure of the 3D porous shaped CNT or CF may have buffer functions for multiple and multi-directional expansion/contraction of silicon. Thereby, it may reduce pulverization of the silicon resulting from the change of volume during charge/discharge. Furthermore, electrons may conduct along the conductive carbon nanotubes or carbon fibers to enhance the efficiency of the conduction path. Hence, the carbon nanotubes or carbon fibers disposed on the broken particles may also provide additional conduction paths for connecting the silicon particles to neighboring silicon particles and to a current collector of the battery even if the silicon particles are broken into smaller particles. At the same time, carbon nanotubes or carbon fibers may also protect the silicon to avoid excessive reactions with the electrolytic solution, and thus may remain high electrode capacity as well as improve cycle life of the battery.

In the method for manufacturing the composite electrode material according to the present invention, the chemical vapor deposition may be completed with evenly mixing with a rotating or stirring mechanism, so that the carbon nanotubes or carbon fibers grow on as many cores as possible and preferably on each core more evenly. Here, the rate of rotation or stirring is not limited and may be changed depending on various rotation or stirring mechanisms as long as the carbon nanotubes or carbon fibers can evenly grow on each core. In addition, conditions for the chemical vapor deposition method are not limited and may be adjusted depending on the desired morphology and size of the carbon nanotubes or carbon fibers.

The chemical vapor deposition according to the present invention is not limited. Furthermore, any known chemical vapor deposition may be used herein as long as the carbon nanotubes or carbon fibers can grow on the surface of each core. It may, by way of example and not limitation, be thermal chemical vapor deposition, plasma chemical vapor deposition, and the like.

In one aspect of the present invention, iron content in ferrocene vapor as a catalyst may permeate into gaps between the silicon nanoparticles and cover the surface of the silicon. The silicon surface can be made rougher or porous chemically or physically to promote the adhesion of catalyst on the silicon surface for subsequent growth of carbon nanotubes. Thereafter, camphor vapor as a carbon source besides ferrocene vapor, which serves as both a carbon source and iron catalyst source, may permeate into the gaps between the silicon nanoparticles covered by ferrocene, and carbon nanotubes or carbon fibers may grow on the surface of the silicon particles through thermal chemical vapor deposition using catalyst. In another aspect of the present invention, silicon particles may be evenly mixed with ferrocene powder in advance and placed in a chamber to deposit the ferrocene on the silicon particles. In the chamber, the silicon particles on which the ferrocene deposits may be mixed with the camphor powder to grow carbon nanotubes or carbon fibers on the silicon particles. In yet another aspect of the present invention, silicon particles, ferrocene powder, and the camphor powder may be evenly mixed in advance and placed in a chamber to grow carbon nanotubes or carbon fibers on silicon nanoparticles.

The catalyst may, by way of example and not limitation, be a Fe-, Mo-, Ni-, Pt-, Co-based catalyst, or the like. Preferably, the catalyst is a Fe-based or Ni-based catalyst. The catalyst can be coated on silicon surface by physical vapor deposition, such as sputtering, thermal evaporation of solid Fe, Ni, or Ti containing source materials, by plating, such as electroless nickel plating. More preferably, the catalyst is contained in a solid Fe-based compound at room temperature, has a high volatility at low temperature compared to the growth temperature of CNT, and is present in gas form in the reactive chamber after heating, for example, ferrocene. The catalyst according to the present invention is not limited thereto as long as it can be used for growing the carbon nanotubes or carbon fibers. The coating of catalyst according to the present invention is not limited thereto vaporization of solid or liquid materials containing the catalyst. Plasma assisted coating such as sputtering, electron beam evaporation, and plating including electroless plating are among possible means of catalyst coating. The catalyst according to the present invention is not limited to metallic catalyst. Solid surfaces with high porosity and high effective surfaces may also serve as an effective catalyst support for the growth of CNT and CF. The carbon source of the present invention is not limited as long as it can be used as a carbon source for growing carbon nanotubes or carbon fibers. Any known gaseous, solid, or liquid carbon source, such as methane, acetylene, camphor and the like, may be used herein. Preferably, the carbon source is solid at room temperature and has a high volatility at low temperature.

Another objective of the present invention is to provide a composite electrode, comprising: a substrate on which an active material layer is disposed, wherein the active material layer comprises a composite electrode material according to any of aforementioned composite electrode materials and an adhesive agent.

The substrate, which serves as a current collector, according to the present invention may be a conductive metal substrate, wherein the conductive metal substrate may, by way of example and not limitation, be copper foil which is commonly used in the art. Furthermore, the thickness of the copper foil is not limited and may be changed as necessary.

In the composite electrode according to the present invention, the adhesive agent is not limited. It may, by way of example and not limitation, be sodium carboxymethyl cellulose (NaCMC), poly acrylic acid (PAA) and the like. In one aspect of the present invention, the adhesive agent is NaCMC.

In the composite electrode according to the present invention, the composite electrode material may be manufactured by the aforementioned method, and therefore, the method will not be described here.

In a common manufacturing method of silicon-based electrode, it is necessary to additionally add auxiliary materials, such as carbon black, for conduction so as to enhance the conduction of electrons between silicon particles as well as to the current collector. However, not like carbon nanotubes or carbon nanofibers, the additional carbon black may increase the weight and volume of the electrode rather than providing buffer functions for expansion/contraction of the silicon particles. On the contrary, since the electrons may be conducted along the carbon nanotubes or carbon fibers, an additional conductive path may be provided. Therefore, in one preferred embodiment of the present invention, even though the carbon black may not be added to support conduction path when manufacturing the composite electrode, the composite electrode remains original capacity at a constant capacity of 2000 mAhg$^{-1}$ after charge/discharge for 100 times. Not like the silicon electrode without carbon nanotubes or carbon fibers coating on, the capacity of the composite electrode may not significantly drop after repeated charge/discharge.

Yet another objective of the present invention is to provide a Li-based battery, comprising: a composite electrode according to the aforementioned electrode; a lithium-containing counter electrode; a separator disposed between the composite electrode and the lithium-containing counter electrode; and an electrolytic solution disposed between the composite electrode and the lithium-containing counter electrode and also disposed on both sides of the separator. A counter electrode (positive electrode) made of lithium metal is used for the convenience of forming a half battery cell for testing the performance of negative electrodes. For real world applications, a whole battery cell is used. For a whole battery cell, the counter electrode (the positive electrode), is not limited to lithium metal.

As described above, the composite electrode material of the present invention has a unique structure, which directly grows the carbon nanotubes or carbon fibers on the surface of the core to form 3D porous carbon nanotubes or carbon fibers coating on silicon nanoparticles. Thereby, it can buffer stress resulted from volume changes of the core material during charge/discharge, and avoid over-reaction between the core and the electrolytic solution in order to increase battery's cycle count. At the same time, carbon nanotubes or carbon fibers can provide conductive path, so that electrons conduct along the carbon nanotubes or carbon fibers to enhance the efficiency of the conduction path. Therefore, it remains excellent charge/discharge characteristics even without adding carbon black during manufacturing of the composite electrode. As a result, the Li-based battery provided by the present invention has a longer battery cycle life and a higher capacity. Moreover, it still has excellent charge/discharge characteristics and Coulomb efficiency after repeated cycles.

As described above, the composite electrode material of the present invention has a unique structure, which directly grows the carbon nanotubes or carbon fibers on the surface of the core to form 3D porous carbon nanotubes or carbon fibers coating on silicon nanoparticles. This manufacturing method overcomes the difficulties in evenly mixing pre-synthesized carbon nanotubes and carbon fibers with silicon particles because carbon nanotubes and carbon fibers are easy in forming clusters and difficult to be separated for mixing evenly with silicon particles. Moreover, carbon nanotubes and carbon fibers directly grown on silicon provide higher electrical conductance between silicon particles and carbon nanotubes and carbon fibers in comparison with a mixture of silicon particles with pre-synthesized carbon nanotubes and carbon fibers which are easily forming clusters. Furthermore, separately synthesized carbon nanotubes and carbon fibers only loosely touch silicon particles resulting in less desirable and higher electrical resistance.

Other objectives, advantages, and novel features of the invention will become more apparent from the following detailed description when taken in conjunction with the accompanying drawings.

DETAILED DESCRIPTION OF THE PREFERRED EMBODIMENT

Preparation Example 1—Preparation of a Composite Electrode Material

Figure 1A:
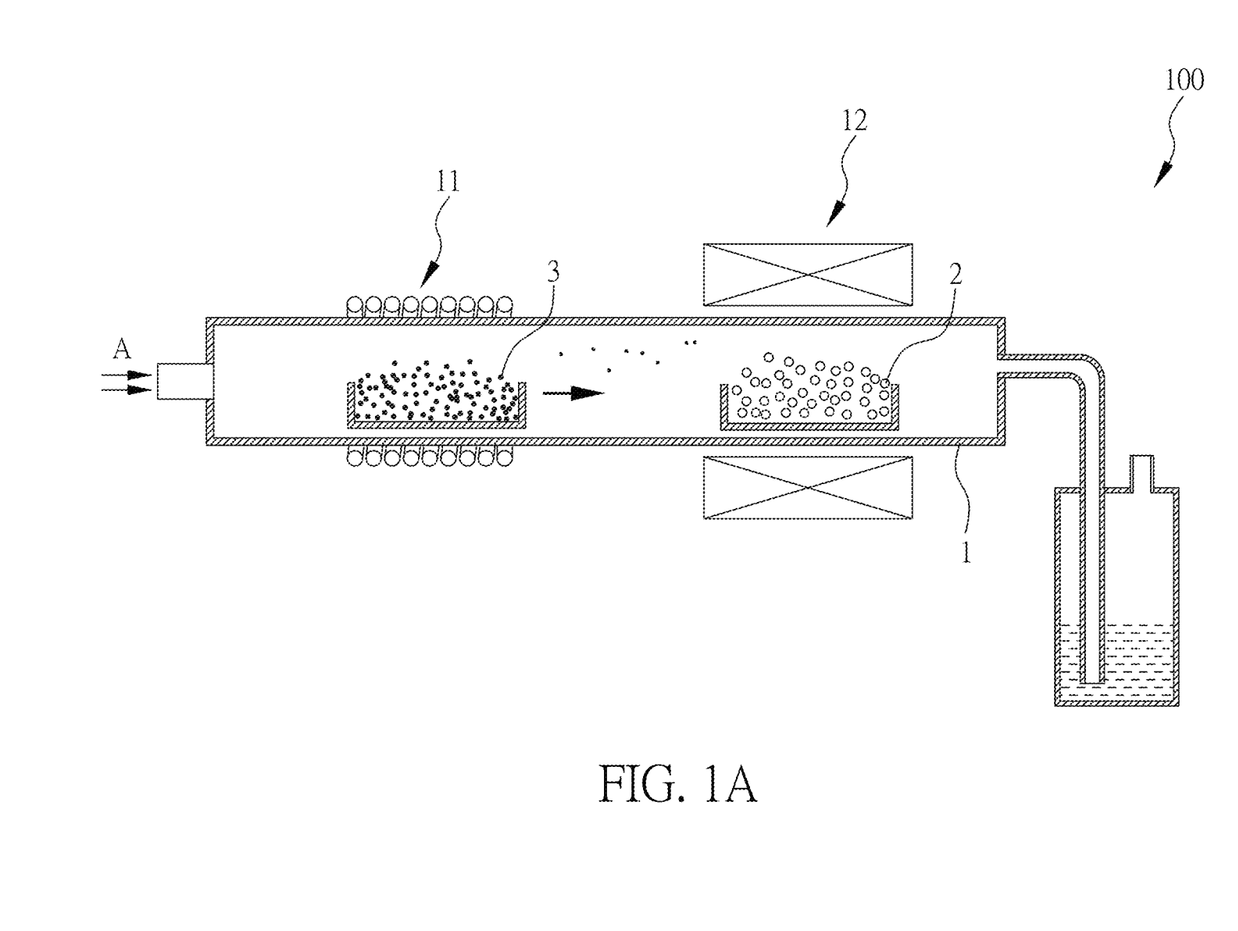
FIG. 1A and FIG. 1B show manufacturing schemes according to one embodiment of the present invention.
Figure 1B:
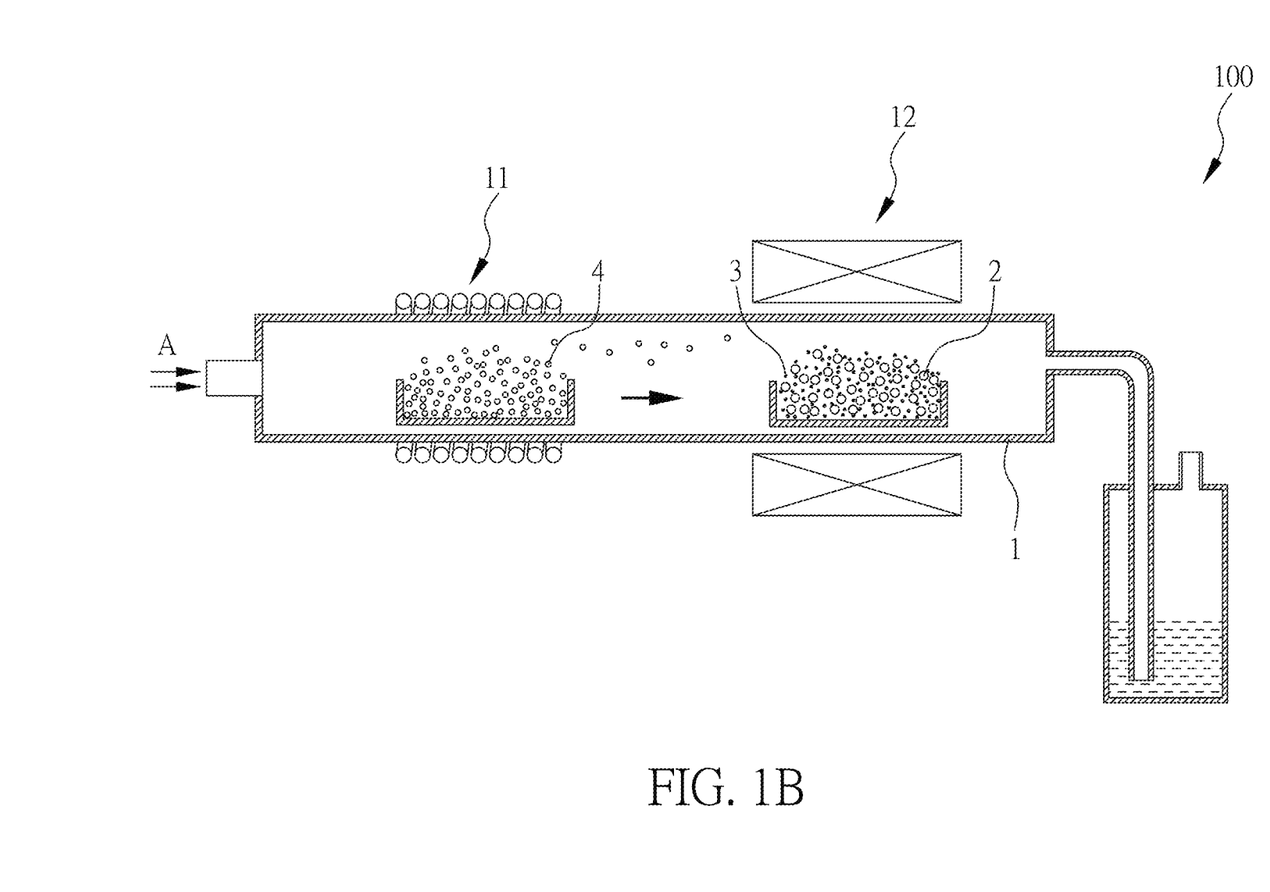

FIGS. 1A and 1B show manufacturing schemes according to the present embodiment. Silicon powder 2 (1.86 g) having a thickness of 100 nm and an average length or width of about 850 nm was placed in a chamber 1 of a second zone 12 of a thermal chemical vapor deposition system 100. Also, ferrocene 3 (3 g) used as an iron source was placed in a first zone 11 of the chamber 1. Thereafter, the chamber 1 was evacuated to high vacuum and backfilled with argon gas (600 sccm, 4 minutes) in a direction of gas flow A to remain the chamber 1 at 1 atm. The argon gas (600 sccm) was remained to flow into the chamber 1 in the direction of gas flow A. At the same time, a high temperature furnace was turned on to ensure the first zone 11 was heated to about 160° C. and the second zone 12 was heated to about 850° C. to decompose and vaporize ferrocene 3. The vaporized iron particles could permeate into gaps between silicon powders, and the deposition time was about 15 minutes. Then the high temperature furnace was turned off, and the chamber 1 was cooled down to room temperature to obtain silicon powder on which iron and iron compounds deposit. Thereafter, camphor 4 (13 g) used as a carbon source was placed in the first zone 11. The chamber 1 was again evacuated to vacuum and filled with argon gas (600 sccm, 4 minutes) in a direction of gas flow A to make the pressure of the chamber 1 back to 1 atm. The high temperature furnace was turned on to heat the first zone 11 to about 160° C. and to heat the second zone 12 to about 850° C., so that the camphor 4 was decomposed and vaporized. The vaporized carbon source (i.e. camphor) could permeate into gaps between silicon powders to grow carbon nanotubes or carbon fibers, and the deposition time was in a range from 15 to 60 minutes. Then the high temperature furnace was turned off, and the chamber 1 was cooled down to room temperature to obtain silicon nanoparticles coated with the carbon nanotubes or carbon fibers. In another aspect of the present invention, a rotating or stirring mechanism (not shown) could be provided in the second zone 12 to evenly mix the mixture, so that the carbon nanotubes or carbon fibers could grow on the core more evenly.

Preparation Example 2—Preparation of a Composite Electrode Material

Figure 2:
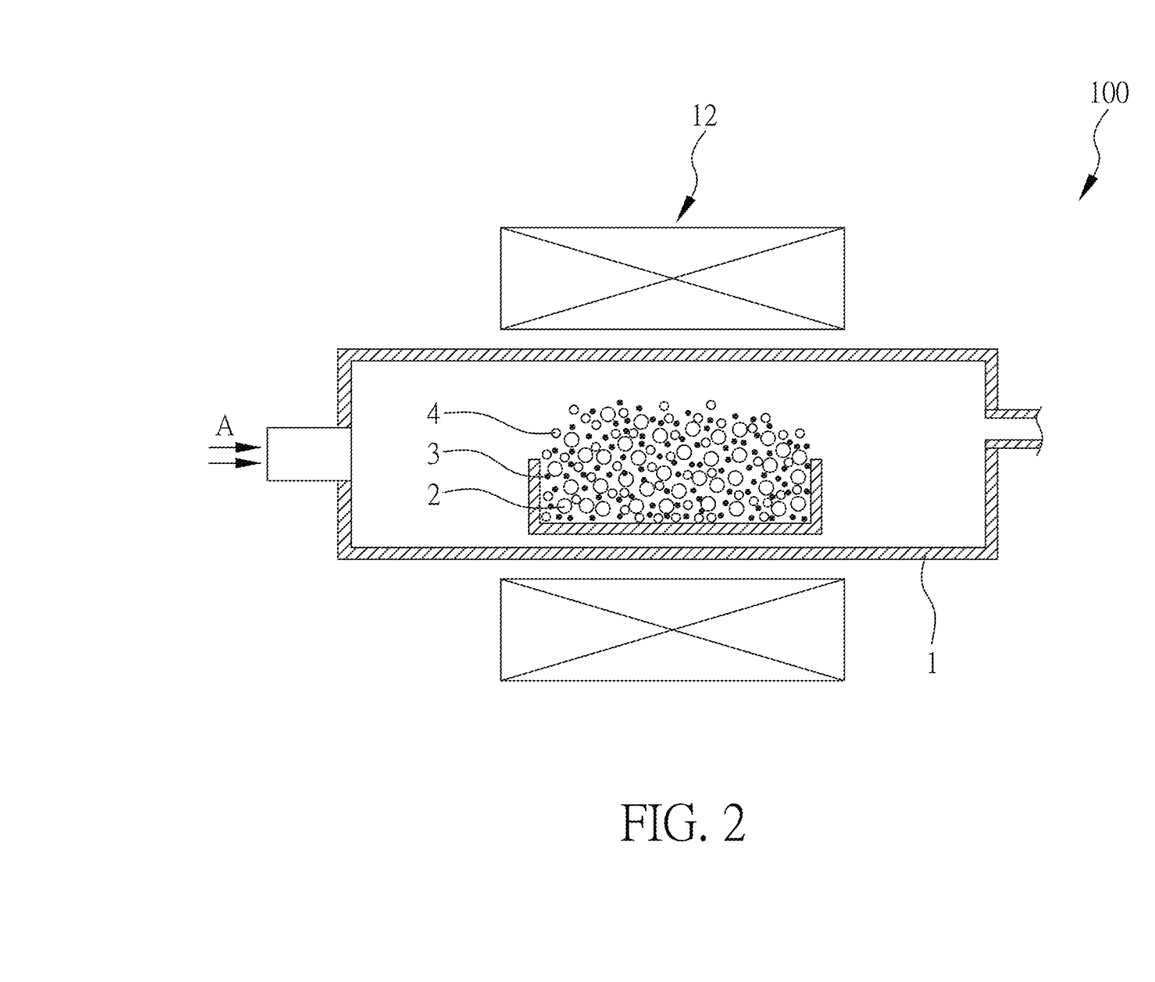
FIG. 2 shows a manufacturing scheme according to another embodiment of the present invention.

FIG. 2 shows a manufacturing scheme according to the present embodiment. Silicon powder 2 (1.86 g) having a thickness of 100 nm and an average length or width of about 850 nm, ferrocene 3 (3 g), and camphor 4 (13 g) were placed in a chamber 1 of a thermal chemical vapor deposition system 100. After the air in the chamber 1 was diluted to remove the air inside and the chamber 1 was backfilled with argon or nitrogen in a direction of gas flow A to about 1 atm pressure, the gas inlet and outlet of the chamber 1 were closed. Thereafter, a high temperature furnace was turned on to heat the chamber 1 to about 850° C. so as to vaporize ferrocene 3 and camphor 4. Both of the vaporized ferrocene and camphor were retained in the chamber 1. Furthermore, carbon nanotubes and carbon fibers grew on the silicon powder at the presence of Fe-based catalyst (i.e. ferrocene), and the deposition time was about 30 minutes. Then the high temperature furnace was turned off, and the chamber 1 was cooled down to room temperature to obtain silicon nanoparticles coated with the carbon nanotubes or carbon fibers. In another aspect of the present invention, a rotating or stirring mechanism (not shown) could be provided in the second zone 12 to evenly mix the silicon powder 2, ferrocene 3 and camphor 4, so that the carbon nanotubes or carbon fibers could grow on the core more evenly.

In the aforementioned Preparation example 1 and Preparation example 2, the carbon nanotubes or carbon fibers grew at atmospheric pressure. In other aspect of the present invention, the carbon nanotubes or carbon fibers also grew at low pressure or in vacuum, for example, from 1 Torr to 1000 Torr, or at higher pressure.

Test Example 1—Composite Electrode Material

Figure 3A:
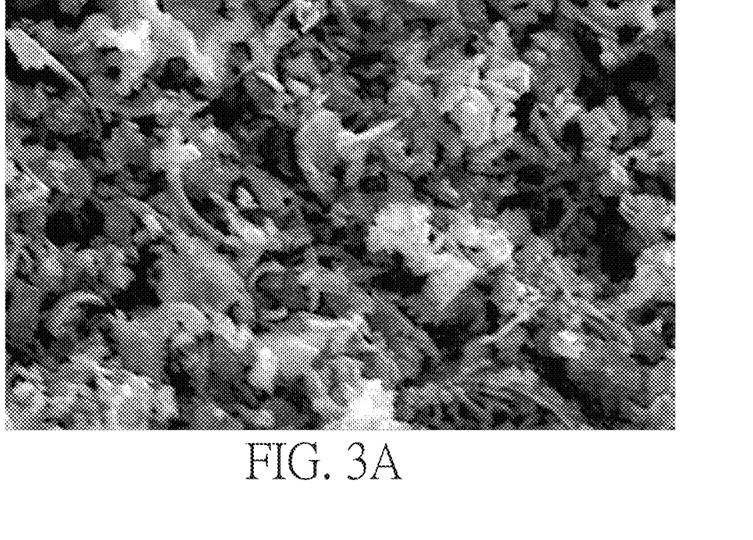
FIG. 3A shows an SEM image of the silicon powder according to one preferred embodiment of the present invention.
Figure 3B:
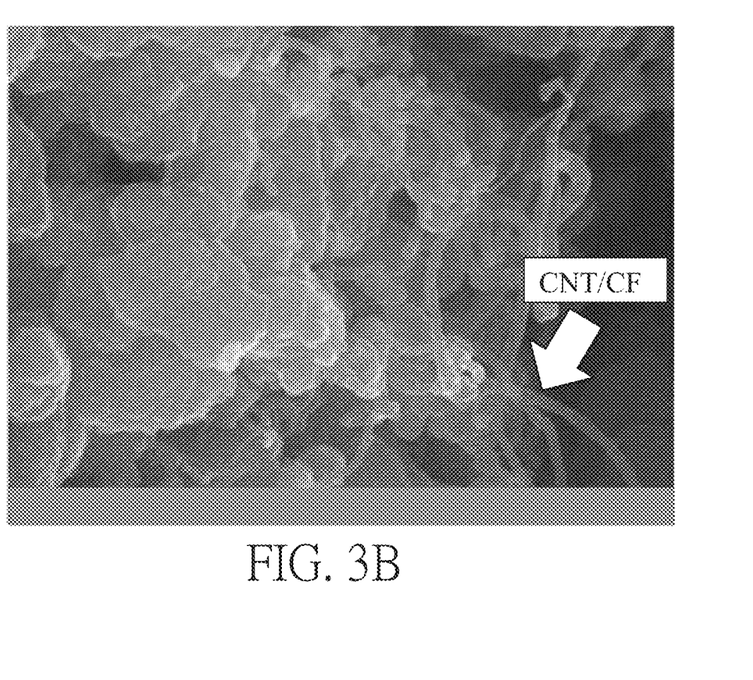
FIG. 3B shows an SEM image of the composite electrode material according to one preferred embodiment of the present invention.
Figure 3C:
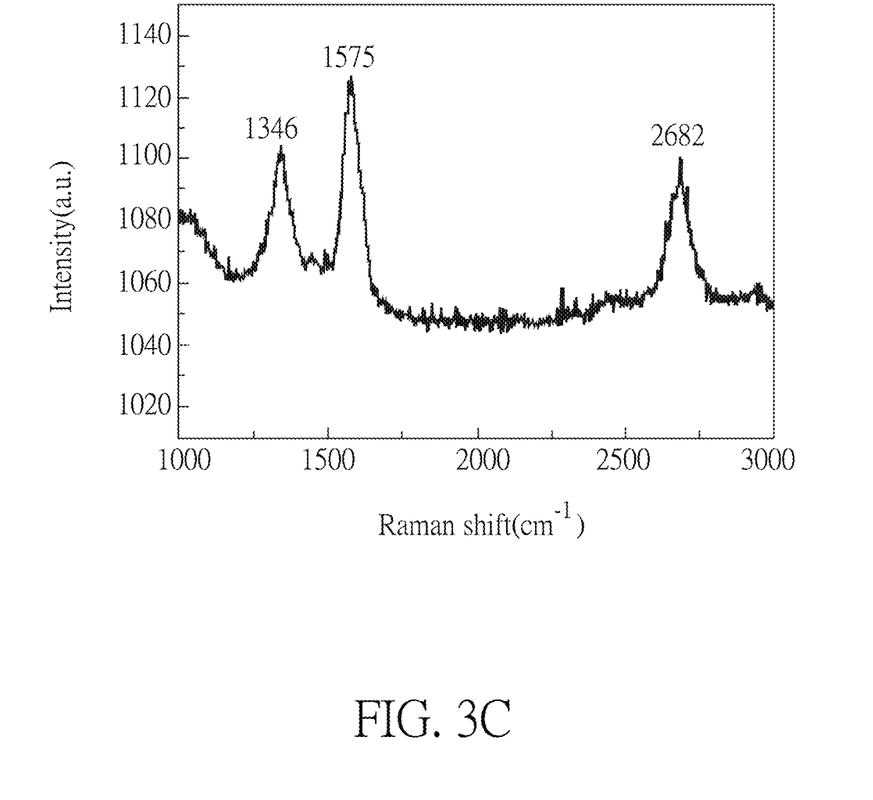
FIG. 3C shows a Raman spectrum of the composite electrode material according to one preferred embodiment of the present invention.

FIG. 3A shows an SEM image of the silicon powder according to the present embodiment, wherein the silicon powder has a thickness of about 100 nm and an average width of about 850 nm and has an irregular morphology and shapes. FIG. 3B shows an SEM image of the composite electrode material according to the present embodiment, and the silicon powder after the thermal chemical vapor deposition process has carbon nanotubes or carbon fibers grown upright on the silicon powder as shown in the figure. FIG. 3C shows a Raman spectrum of the composite electrode material according to the present invention, and the Raman spectrum was using green laser (λ=532 nm) for excitation. Moreover, a D band of 1346 $cm^{-1}$, G band of 1575 $cm^{-1}$ and 2D band of 2682 $cm^{-1}$, which indicated carbon nanotubes or carbon fibers grown on the surface of the silicon, were shown in FIG. 3C. The aforementioned experimental results demonstrated that the composite electrode material of the present embodiment formed carbon nanotubes or carbon fibers on the surface of the silicon powder.

Preparation Example 3—Preparation of a Composite Electrode

A composite electrode material according to the present invention, a conductive carbon black and an adhesive agent sodium carboxymethyl cellulose (NaCMC) were mixed at a weight ratio of 6:3:1. Then the mixture was added with deionized water, and stirred with a DC mixer to obtain a homogeneous active material. The homogeneous active material was placed in a vacuum chamber which was evacuated to a low pressure to remove internal bubbles of the homogeneous active material. Thereafter, a copper foil (10 μm) was provided and coated with 30 μm thick of the active material using a scraper to obtain an electrode. The coated electrode was placed in a vacuum oven, evacuated to vacuum, and baked at 65° C. for 8-12 hours to remove extra solvent. After cooling, the roll-press machine rolled and pressed the baked electrode to raise a packaging density of the electrode. Finally, the electrode was cut into a desired size. In one aspect of the present invention, the active material used to prepare the composite electrode may not contain a conductive carbon black. The thickness of the coated active material of the present invention and the pressure applied to roll and press are not limited to the present embodiment.

Preparation Example 4—Preparation of Lithium Half-Cell

Figure 4:
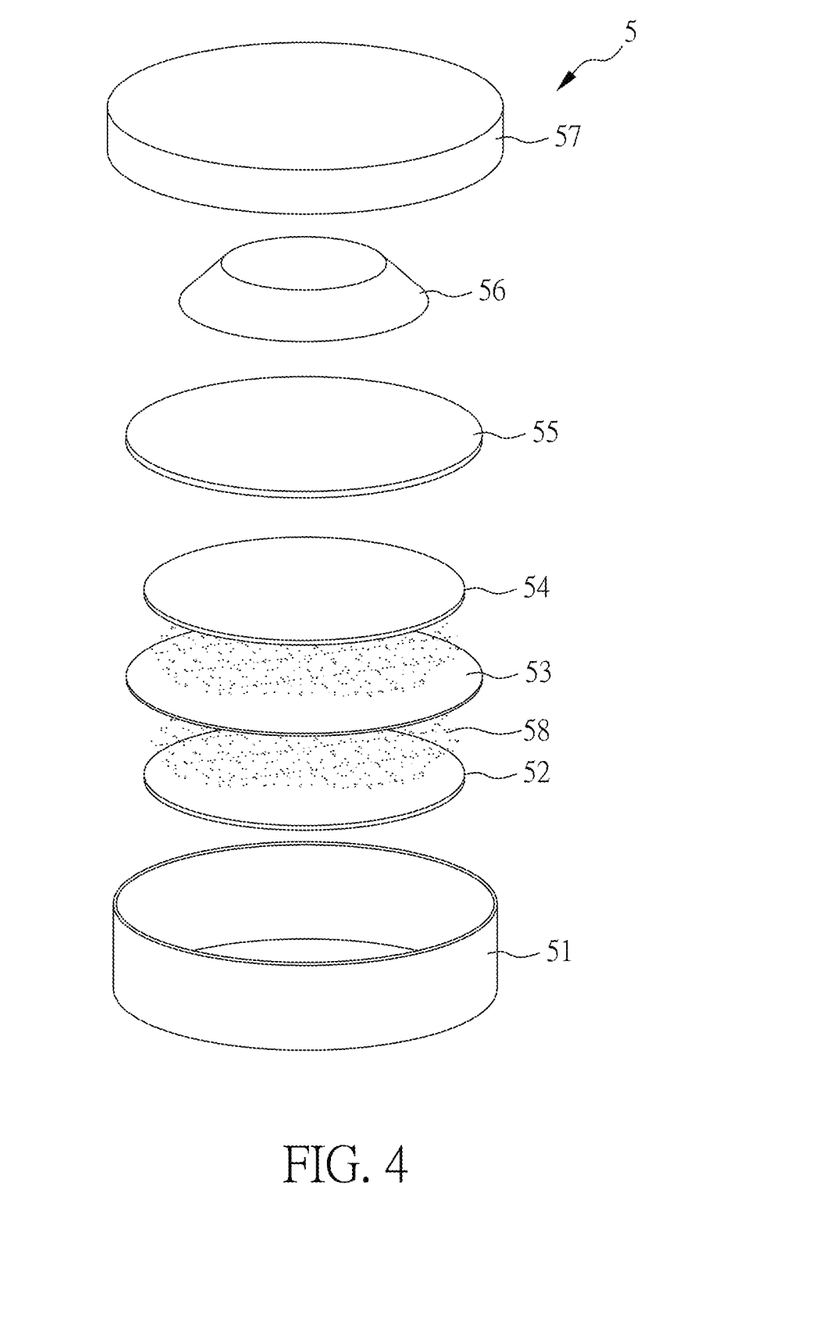
FIG. 4 shows a scheme of the Li-based battery according to one preferred embodiment of the present invention.

FIG. 4 shows a scheme of the Li-based battery according to the present embodiment. Here, a composite electrode 52 (as an anode) prepared by the aforementioned embodiment, a metallic bottom cover 51, a lithium counter electrode 54, a separator 53 (Celgard 2355), a metal gasket 55, a metal spring 56, and a metallic top cover 57 were placed in a glove box, and 1M $LiPF_6$ solution dissolved in EC/DEC (1:1 v/v) was used as a electrolytic solution 58. Moreover, above-mentioned components were assembled into one button cell in accordance with FIG. 4, and sealed with a cell packaging machine to form a half-cell of the present embodiment. However, this embodiment is merely for illustration, and the lithium half-cell of the present invention is not limited thereto.

As shown in FIG. 4, a Li-based battery of the present embodiment includes: a composite electrode 52 prepared as described above; a lithium counter electrode 54; a separator 53 disposed between the composite electrode 52 and the lithium counter electrode 54; an electrolytic solution 58 disposed between the composite electrode 52 and the lithium counter electrode 54 and also disposed on both sides of the separator 53.

Test Example 2-Cycle Analysis for Charge/Discharge

The present embodiment used a constant current charge/discharge method, and the charge/discharge rate of the first three cycles was 0.02C. Thereafter, the charge/discharge rate was changed to 0.1C in the remaining test. The composite electrode material and the composite electrode were prepared by the aforementioned method, and thus omitted from description.

Figure 5A:
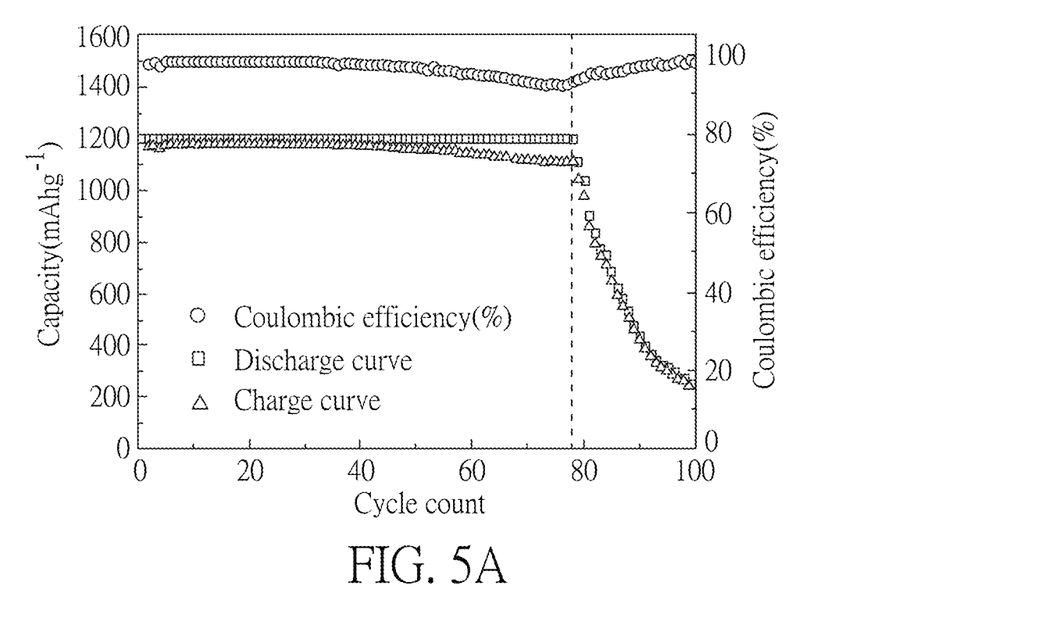
FIG. 5A and FIG. 5B show the relationship between the charge/discharge and cycle count of the silicon electrode at a constant capacity.
Figure 5B:
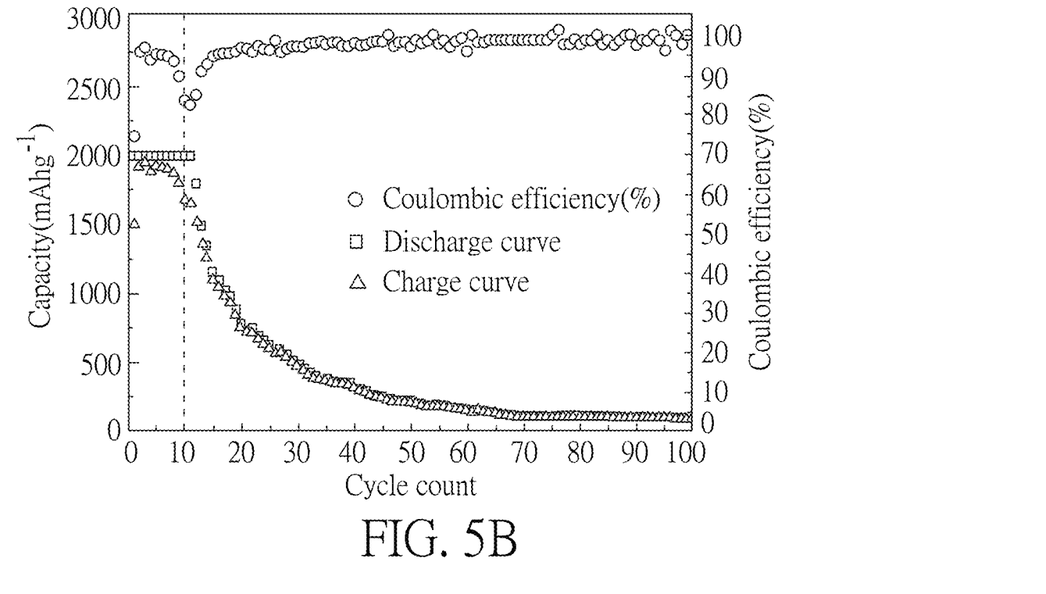

FIGS. 5A and 5B show the relationship between capacity and cycle count of a silicon electrode at a constant capacity (1200 $mAhg^{-1}$ and 2000 $mAhg^{-1}$ respectively). As shown in FIG. 5A, the cycle count of the silicon electrode was 80 at constant capacity 1200 $mAhg^{-1}$. However, when the capacity was raised to 2000 $mAhg^{-1}$, the silicon electrode could only maintain around 10 cycles, as shown in FIG. 5B.

Figure 6A:
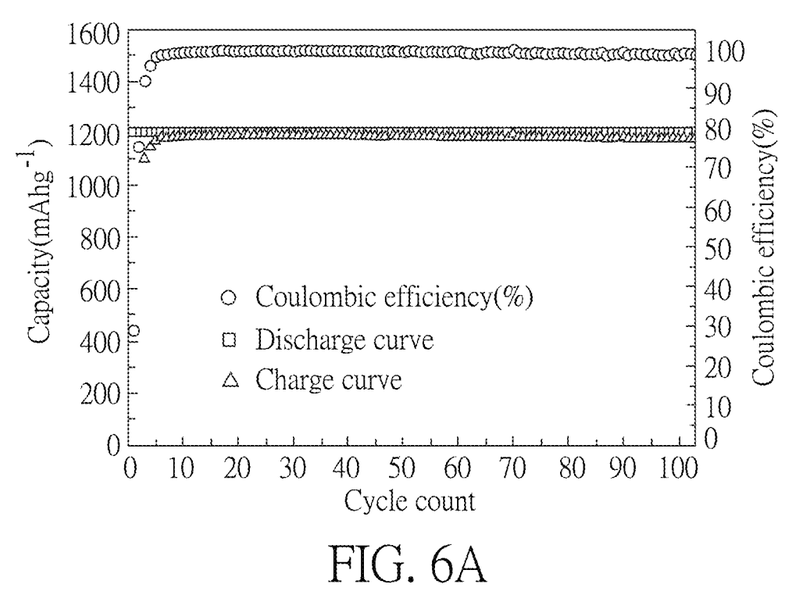
FIG. 6A and FIG. 6B show the relationship between charge/discharge and cycle count of the composite electrode at a constant capacity.
Figure 6B:
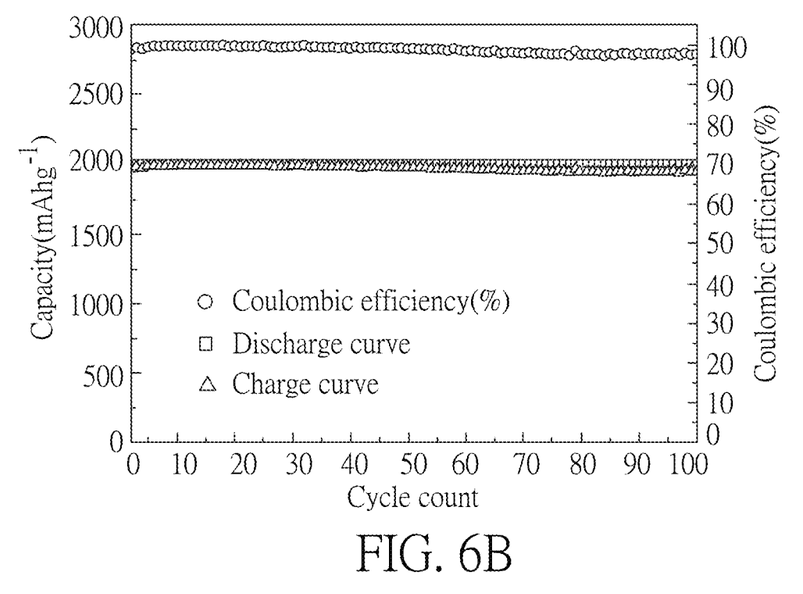

FIG. 6A and FIG. 6B show the relationship between capacity and cycle count of a composite electrode at a constant capacity (1200 $mAhg^{-1}$ and 2000 $mAhg^{-1}$ respectively). As shown in FIGS. 6A and 6B, the composite electrode could maintain 100 cycles whenever at low capacity (1200 $mAhg^{-1}$) or high capacity (2000 $mAhg^{-1}$). It demonstrated that the silicon powder on which carbon nanotubes or carbon fibers grew could buffer the stress resulted from volume expansion/contraction of the silicon powder at the time of charge/discharge. Thereby it could reduce the presence of broken silicon powder to prolong the cycle life.

Figure 7A:
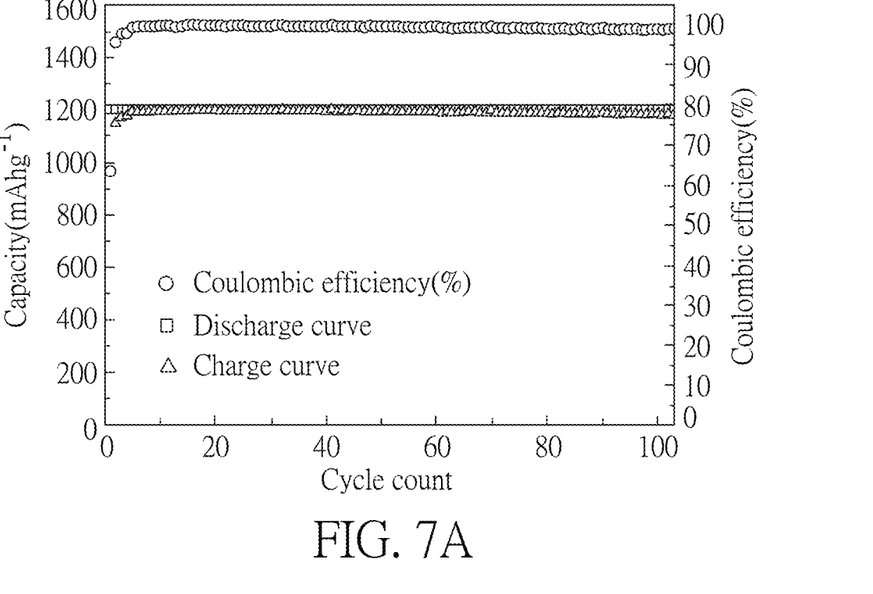
FIG. 7A and FIG. 7B show the relationship between the charge/discharge and cycle count of the composite electrode without carbon black at a constant capacity.
Figure 7B:
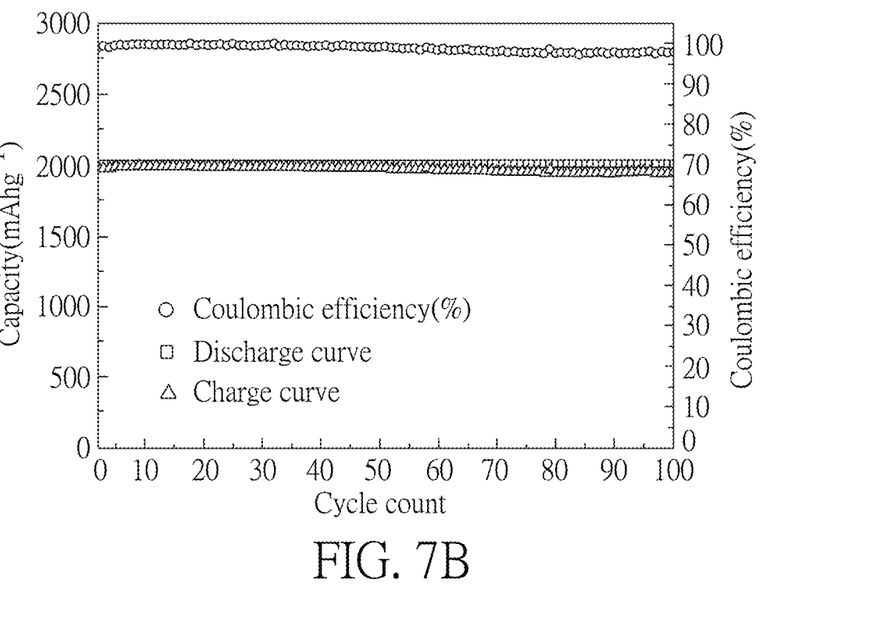

FIGS. 7A and 7B show the relationship between capacity and cycle count of the composite electrode at a constant capacity (1200 $mAhg^{-1}$ and 2000 $mAhg^{-1}$ respectively) according to another embodiment of the present invention. Wherein, an active material for preparing the composite electrode of the present embodiment did not comprise a conductive carbon black. Further, the remaining composite electrode material and the composite electrode were prepared by the aforementioned method, and thus omitted from description. Commonly, conductive carbon black is used when manufacturing an active material of an electrode. However, the experimental results showed that the composite electrode of the present embodiment maintained 100 cycles at a high capacity even though the conductive carbon black was not added. As a result, it demonstrated that carbon nanotubes or carbon fibers could provide additional conductive paths to enhance the efficiency of the conductive paths.

Although the present invention has been explained in relation to its preferred embodiment, it is to be understood that many other possible modifications and variations can be made without departing from the spirit and scope of the invention as hereinafter claimed.

What is claimed is:

1. A composite electrode material, comprising:
 a core, wherein a material of the core is at least one selected from the group consisting of Sn, Sb, Si, Ge, C, and compounds thereof; and
 a plurality of carbon nanotubes or a plurality of carbon fibers,
 wherein the carbon nanotubes or the carbon fibers grow on a surface including a surface of the core and on the carbon nanotubes or the carbon fibers, and the carbon nanotubes or the carbon fibers form a three-dimensional porous mesh or sponge-like structure coating the core;
 wherein a thickness of the core is in a range from 50 nm to 500 nm, and the core is a thin sheet of paper-like flake.

2. The composite electrode material as claimed in claim 1, wherein the carbon nanotubes or the carbon fibers grow upright on the surface.

3. The composite electrode material as claimed in claim 1, wherein an average length or an average width of the core is in a range from 500 nm to 1200 nm.

4. A method for manufacturing a composite electrode material, comprising steps of:
 providing a core, wherein a material of the core is at least one selected from the group consisting of Sn, Sb, Si, Ge, C, and compounds thereof, a thickness of the core is in a range from 50 nm to 250 nm, and the core is a thin sheet of paper-like flake; and
 growing a plurality of carbon nanotubes or a plurality of carbon fibers on a surface and on the carbon nanotubes or the carbon fibers through a chemical vapor deposition using a catalyst, wherein the surface includes a surface of the core, and the carbon nanotubes or the carbon fibers form a three-dimensional porous mesh or sponge-like structure coating the core.

5. The method as claimed in claim 4, wherein the chemical vapor deposition is completed with evenly mixing with a rotating or stirring mechanism.

6. The method as claimed in claim 4, wherein the chemical vapor deposition method is a thermal chemical vapor deposition.

7. The method as claimed in claim 4, wherein the catalyst is a Fe-based or Ni-based catalyst.

8. The method as claimed in claim 4, wherein the carbon nanotubes or the carbon fibers grow upright on the surface.

9. The method as claimed in claim 4, wherein an average length or an average width of the core is in a range from 500 nm to 1200 nm.

10. A composite electrode, comprising:
 a substrate on which an active material layer is disposed, wherein the active material layer comprises:
 a composite electrode material, comprising:
 a core, wherein a material of the core is at least one selected from the group consisting of Sn, Sb, Si, Ge, C, and compounds thereof, a thickness of the core is in a range from 50 nm to 250 nm, and the core is a thin sheet of paper-like flake; and
 a plurality of carbon nanotubes or a carbon fibers,
 wherein the carbon nanotubes or the carbon fibers grow on a surface including a surface of the core and on the carbon nanotubes or the carbon fibers, and the carbon nanotubes or the carbon fibers form a three-dimensional porous mesh or sponge-like structure coating the core; and
 an adhesive agent.

11. The composite electrode as claimed in claim 10, wherein the substrate is a conductive metal plate.

12. The composite electrode as claimed in claim 10, wherein the composite electrode does not comprise a carbon black.

13. A Li-based battery, comprising:
 a composite electrode, comprising:
 a substrate on which an active material layer is disposed, wherein the active material layer comprises:
 a composite electrode material, comprising:
 a core, wherein a material of the core is at least one selected from the group consisting of Sn, Sb, Si, Ge, C, and compounds thereof, a thickness of the core is in a range from 50 nm to 1200 nm, and the core is a thin sheet of paper-like flake; and
 a plurality of carbon nanotubes or a carbon fibers,
 wherein the carbon nanotubes or the carbon fibers grow on a surface including a surface of the core and on the carbon nanotubes or the carbon fibers, and the carbon nanotubes or the carbon fibers form a three-dimensional porous mesh or sponge-like structure coating the core; and
 an adhesive agent;
 a lithium-containing counter electrode;
 a separator disposed between the composite electrode and the lithium-containing counter electrode; and
 an electrolytic solution disposed between the composite electrode and the lithium-containing counter electrode and also disposed on both sides of the separator.

* * * * *